(12) United States Patent
Hirafuji et al.

(10) Patent No.: US 7,448,439 B2
(45) Date of Patent: Nov. 11, 2008

(54) HEAT EXCHANGER

(75) Inventors: Kazuo Hirafuji, Kawasaki (JP);
Toshimitsu Kobayashi, Kawasaki (JP);
Yuuji Hasegawa, Kawasaki (JP);
Manabu Miyamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/984,984

(22) Filed: Nov. 10, 2004

(65) Prior Publication Data

US 2005/0061485 A1 Mar. 24, 2005

Related U.S. Application Data

(63) Continuation of application No. PCT/JP02/06958, filed on Jul. 9, 2002.

(51) Int. Cl.
*F28F 13/00* (2006.01)
*A23C 3/02* (2006.01)
*F28F 7/00* (2006.01)

(52) U.S. Cl. .......................... 165/135; 165/185; 165/66

(58) Field of Classification Search .................. 165/10, 165/48.1, 52, 58–59, 66, 104.21, 104.13, 165/144, 185, 135; 312/236, 237; 403/363; 454/233, 236
See application file for complete search history.

(56) References Cited

U.S. PATENT DOCUMENTS

| | | | | |
|---|---|---|---|---|
| 1,725,906 A | * | 8/1929 | Gay ....................... 165/104.21 |
| 3,912,208 A | * | 10/1975 | Grenetier ..................... 248/99 |
| 4,098,326 A | * | 7/1978 | Waters ........................ 165/76 |
| 4,230,173 A | * | 10/1980 | Eastman et al. ............. 165/274 |
| 4,333,520 A | * | 6/1982 | Yanadori et al. ............... 165/59 |
| 4,600,050 A | * | 7/1986 | Noren .................. 165/104.14 |
| 4,706,739 A | * | 11/1987 | Noren .................. 165/104.14 |
| 5,123,479 A | * | 6/1992 | Pravda ........................ 165/86 |
| 5,524,453 A | * | 6/1996 | James ........................ 62/434 |
| 6,035,927 A | * | 3/2000 | Krauss et al. ............... 165/135 |
| 6,062,301 A | * | 5/2000 | Lu ............................ 165/80.3 |
| 6,148,725 A | * | 11/2000 | Knauer et al. ............... 101/217 |
| 6,269,003 B1 * | | 7/2001 | Wen-Chen .................. 361/704 |
| 6,281,887 B1 * | | 8/2001 | Wang ........................ 345/173 |

FOREIGN PATENT DOCUMENTS

| | | | |
|---|---|---|---|
| JP | 58217195 A | * | 12/1983 |
| JP | 61-119995 | | 6/1986 |
| JP | 62-33291 | | 2/1987 |
| JP | 2-54063 | | 4/1990 |
| JP | 04199736 A | * | 7/1992 |
| JP | 2002-009455 | | 1/2002 |
| JP | 2002-188894 | | 7/2002 |

OTHER PUBLICATIONS

Japanese Office Action dated Dec. 11, 2007, from the corresponding Japanese Application.

* cited by examiner

*Primary Examiner*—Tho V Duong
(74) *Attorney, Agent, or Firm*—Katten Muchin Rosenman LLP

(57) ABSTRACT

A heat exchanger includes a plurality of unit modules aligned in parallel, in which each unit module has a heat exchange function.

4 Claims, 17 Drawing Sheets

HEAT EXCHANGER

CROSS-REFERENCE TO RELATED APPLICATION

This application is a U.S. continuation application filed under 35 USC 111(a) claiming benefit under 35 USC 120 and 365(c) of PCT application JP02/06958, filed on Jul. 9, 2002, with the Japanese Patent Office. The foregoing application is hereby incorporated herein by reference.

BACKGROUND OF THE INVENTION

1. Field of the Invention

The present invention generally relates to a heat exchanger for releasing heat from the inside of a casing to the outside. More particularly, a heat exchanger suitably applicable for a cabinet having an information processing electronic device unit such as a communication apparatus that generates large amounts of heat.

2. Description of the Related Art

In recent years, there has been, for example, an urgent demand for installing next-generation mobile base stations. Along with the growing installment of the next-generation mobile base stations, the demand for outdoor type base station installations has been increasing both domestically and internationally. Such mobile base station installations have an information processing electronic device unit (such as a high performance communication apparatus) installed inside a cabinet. Since the cabinet is disposed outdoors, it is preferable that the cabinet be in a hermetically sealed state.

Since a large amount of heat is generated from the communication apparatus and the like, such heat is to be released to the external. Accordingly, it is preferable to provide a cabinet with a heat exchanger having high thermal efficiency and excellent water-resistance for preventing water from entering in situations such as rain.

FIG. 1 is a diagram showing an example of a conventional cabinet 100 installed with a communication apparatus or the like. The cabinet 100, being installed with a communication apparatus or the like (not shown), generates a large amount of heat. Therefore, the cabinet 100 is provided with a heat exchanger 110 disposed at a portion of a front side door.

The heat exchanger 110 includes, for example, a fan 111 for drawing in external air FA, a heat exchange part 120, and a fan 112 for sending internal high temperature air IHA heated by the communication apparatus to the heat exchange part 120.

The external air FA is turned into a high temperature exhaust air HA by absorbing heat by contacting a heat pipe 121 and a fin 122 in the heat exchange part 120, and is exhausted from the cabinet 100. Meanwhile, the internal high temperature air IHA is turned into an internal low temperature air ICA by having its heat absorbed by contacting the heat pipe 121 and the fin 122, and is re-used for cooling the communication apparatus. Accordingly, the heat exchanger 110 prevents the temperature inside the cabinet 100 from becoming excessively high.

Since the cabinet 100 is disposed outdoors, the cabinet 100 is exposed to wind and rain. Malfunctions in the communication apparatus are caused, particularly, when rain (water) enters the cabinet 100. Therefore, the heat exchange part 120 is provided with a water-resistant partition plate 125 disposed substantially at its center, and is also applied with a sealing process at its surrounding such as applying caulking to joint areas where water is likely to enter.

Meanwhile, in recent years and continuing, the floor area for installing (establishing) the above-described cabinet 100 is becoming smaller, and a demand for installing a high density communication apparatus or the like into the size-reduced cabinet 100 is increasing. Under these circumstances, a heat exchanger with greater thermal efficiency is desired since obtaining more space for installing the heat exchanger is difficult.

However, since the above-described conventional heat exchanger 110 provides low heat exchange effectiveness since the heat exchanger 110 employs a long wave-shaped heat pipe 121 for allowing a cooling medium to flow therethrough. Although it is possible to improve heat exchange performance by increasing the number of heat exchangers, such increase not only causes difficulty in obtaining installment space, but also increases cost, and reduces transportability due to increase of weight.

Furthermore, since the conventional heat exchanger 110 is structured having numerous fins 122 attached to the long heat pipe 121, applying a water-protectant such as the sealing process is difficult and costly. Furthermore, it is difficult in inspecting whether there are any defective (missed) areas in the sealing process. In addition, even if a defective area is found, repairing (reinforcing) the defective area is difficult.

Other than the above-described heat exchanger 110, there is another type of heat exchanger having a heat exchange part with plural planar heating units and heat absorbing units alternately attached to each other. However, this type of heat exchanger requires more manufacture cost since all of its joint portions between each of the units are to be sealed with caulking or the like.

SUMMARY OF THE INVENTION

It is a general object of the present invention to provide a heat exchanger that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a heat exchanger particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a heat exchanger including: a plurality of unit modules aligned in parallel, each unit module having a heat exchange function.

In the heat exchanger according to an embodiment of the present invention, the unit module may include a plurality of heat transmitting fins disposed at a prescribed part between a wave-shaped heat lane.

In the heat exchanger according to an embodiment of the present invention, the unit module may have a partition mechanism for dividing the unit module into a heat releasing side and a heat absorbing side.

In the heat exchanger according to an embodiment of the present invention, the partition mechanism may define a plurality of spaces disposed within the wave-shaped heat lane, and may include a plurality of receptacle parts selectively insertable into the spaces, and a plurality of plate members selectively insertable into the receptacle parts.

In the heat exchanger according to an embodiment of the present invention, the receptacle parts may have at least one of a water resistant property and an elastic property.

In the heat exchanger according to an embodiment of the present invention, each of the plate members may have a rear end part that protrudes from the receptacle part when inserted into the receptacle part, wherein the receptacle part may have a connection part formed at a front end side for receiving the rear end part of another plate member.

In the heat exchanger according to an embodiment of the present invention, the heat exchanger may further include a plurality of holding members for holding the unit modules in the aligned state, wherein the holding members may include a fixing mechanism for fixing the unit modules.

In the heat exchanger according to an embodiment of the present invention, the heat exchanger may be disposed at a part of an outer wall of a cabinet.

Furthermore, the present invention provides another heat exchanger including: a plurality of unit modules, each unit module having an independent heat exchange function and defining a flow path direction therethrough; wherein the plurality of unit modules are stacked with respect to one another in the flow path direction.

In another heat exchanger according to an embodiment of the present invention, each unit module may include a partition mechanism, and wherein the partition mechanisms of the stacked unit modules together may form a partition part extending in the flow path direction that divides the stacked unit modules into a heat releasing side and a heat absorbing side.

Furthermore, the present invention provides another heat exchanger including: a plurality of unit modules, each unit module having an independent heat exchange function and including a position defining mechanism; wherein the plurality of unit modules are stacked end to end with respect to one another, and the position defining mechanism of one unit module mates with the position defining mechanism of an adjacent unit module to align the adjacent unit modules end to end with respect to one another.

In another further heat exchanger according to an embodiment of the present invention, the position defining mechanism of one unit module may mate with the position defining mechanism of an adjacent unit module to form a partition part extending in the end to end direction, the partition part dividing the stacked unit modules into a heat releasing side and a heat absorbing side.

Furthermore, the present invention provides a unit module for use in a heat exchanger, the unit module including: a heat exchanging structure defining a flow path direction therethrough; and a partition mechanism extending in the flow path direction dividing the heat exchanging structure into a heat absorbing side and a heat releasing side; wherein the partition mechanism includes a receptacle part having a passage and a plate inserted into the passage and secured in the receptacle part.

Other objects and further features of the present invention will be apparent from the following detailed description when read in conjunction with the accompanying drawings.

DESCRIPTION OF THE PREFERRED EMBODIMENTS

In the following, embodiments of the present invention are described with reference to the accompanying drawings.

Figure 1:
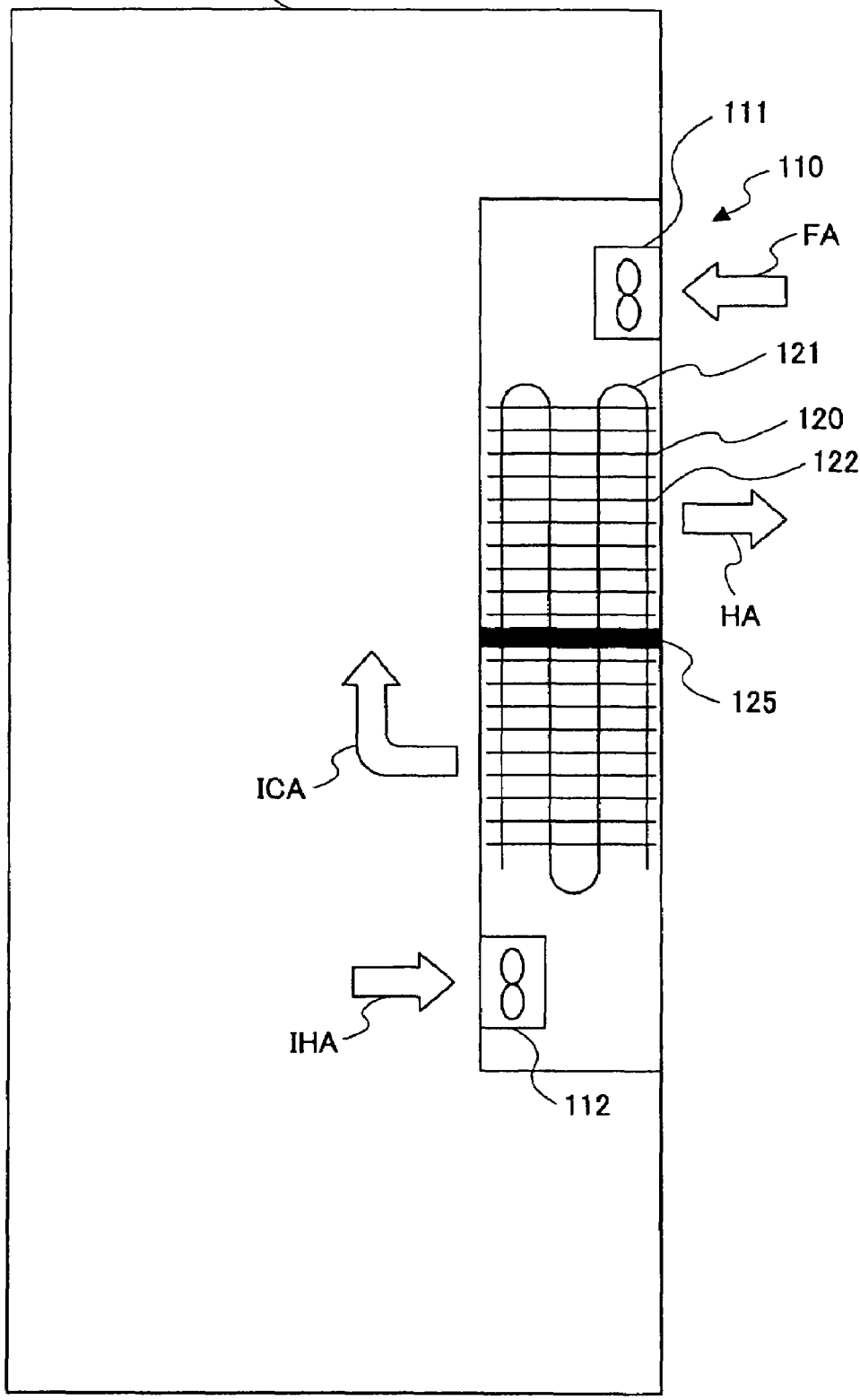
FIG. 1 is a schematic drawing showing a conventional example of a cabinet for installing a communication apparatus.
Figure 2:
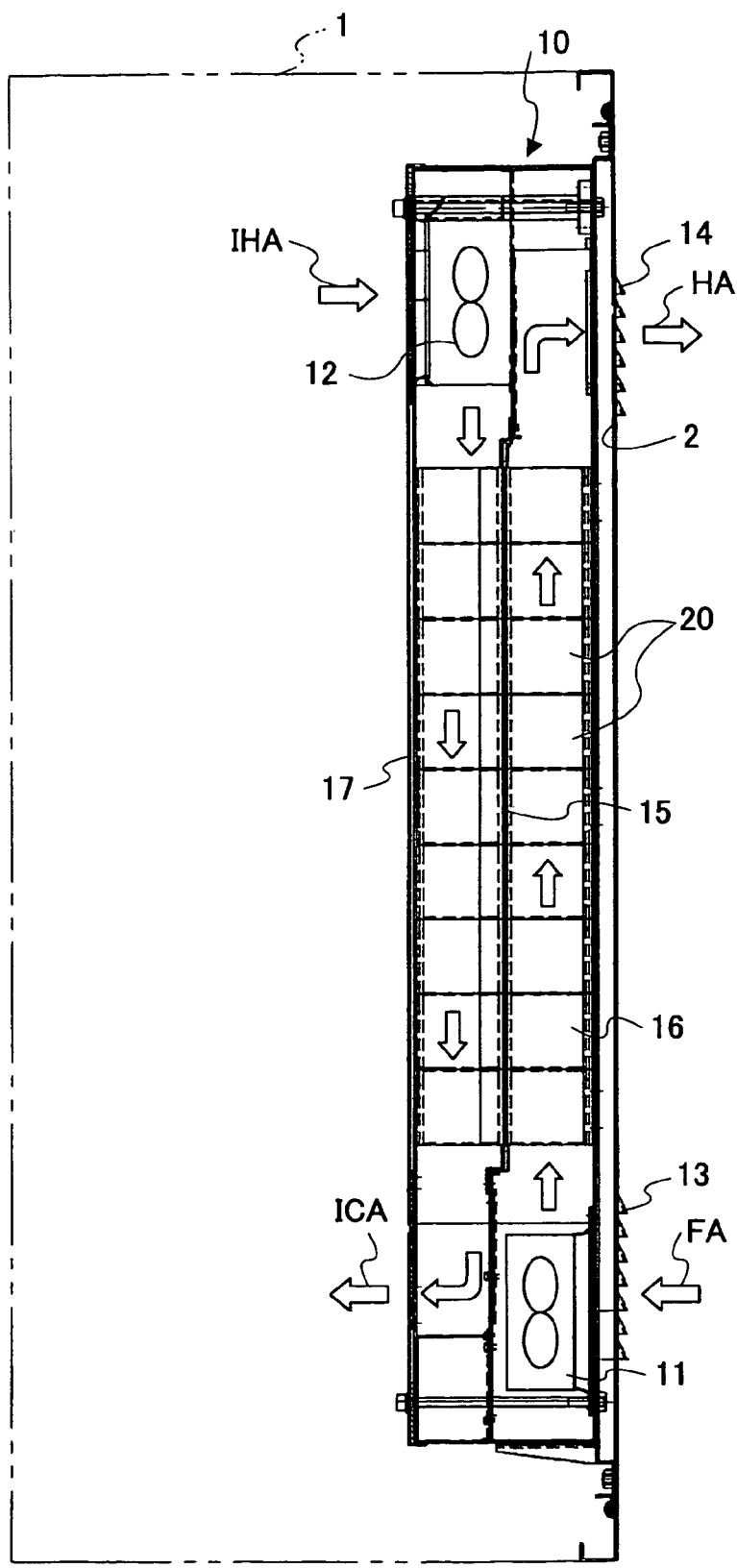
FIG. 2 is a schematic drawing showing a side part of a cabinet having a heat exchanger according to an embodiment of the present invention.

FIG. 2 is a schematic diagram showing a side part of a cabinet 1 having a heat exchanger 10 according to an embodiment of the present invention.

The cabinet 1 shown in FIG. 2 is structured for allowing an information processing electronic device unit such as a communication apparatus (not shown) to be installed therein. The cabinet 1 includes a front side door 2. The heat exchanger 10 is disposed with respect to a part of the front side door in the manner illustrated in FIG. 2, for example.

The heat exchanger 10 has a casing 17 installing therein, for example, a fan 11 for absorbing external air FA via an intake port 13, a heat exchange part 16 for performing heat exchange between the external air FA and the air inside the cabinet 1, and a fan 12 for sending internal high temperature air IHA from the communication apparatus to the heat exchange part 16.

The heat exchange part 16 according to an embodiment of the present invention includes plural unit modules 20 disposed in parallel, or end-to-end, for example. Each unit module 20 has a heat exchange function. The unit modules 20 of the heat exchange part 16 are described in further detail below. The heat exchange part 16 is divided by a partition part 15 at its center into an inner side (heat releasing side) and an outer side (heat absorbing side), to thereby enable heat exchange without having the external air FA and the internal high temperature air IHA contact with each other.

That is, the external air FA absorbs heat by passing through the heat exchange part 16 and is exhausted from an exhaust port 14 in the form of high temperature exhaust air HA. Meanwhile, the internal high temperature air IHA releases heat by passing through the heat exchange part 16 and is re-used for cooling the side toward the communication apparatus in the form of internal low temperature air ICA. Accordingly, the heat generated from the communication apparatus and accumulated inside the cabinet 1 can be exhausted to the outside of the cabinet 1.

Figure 3:
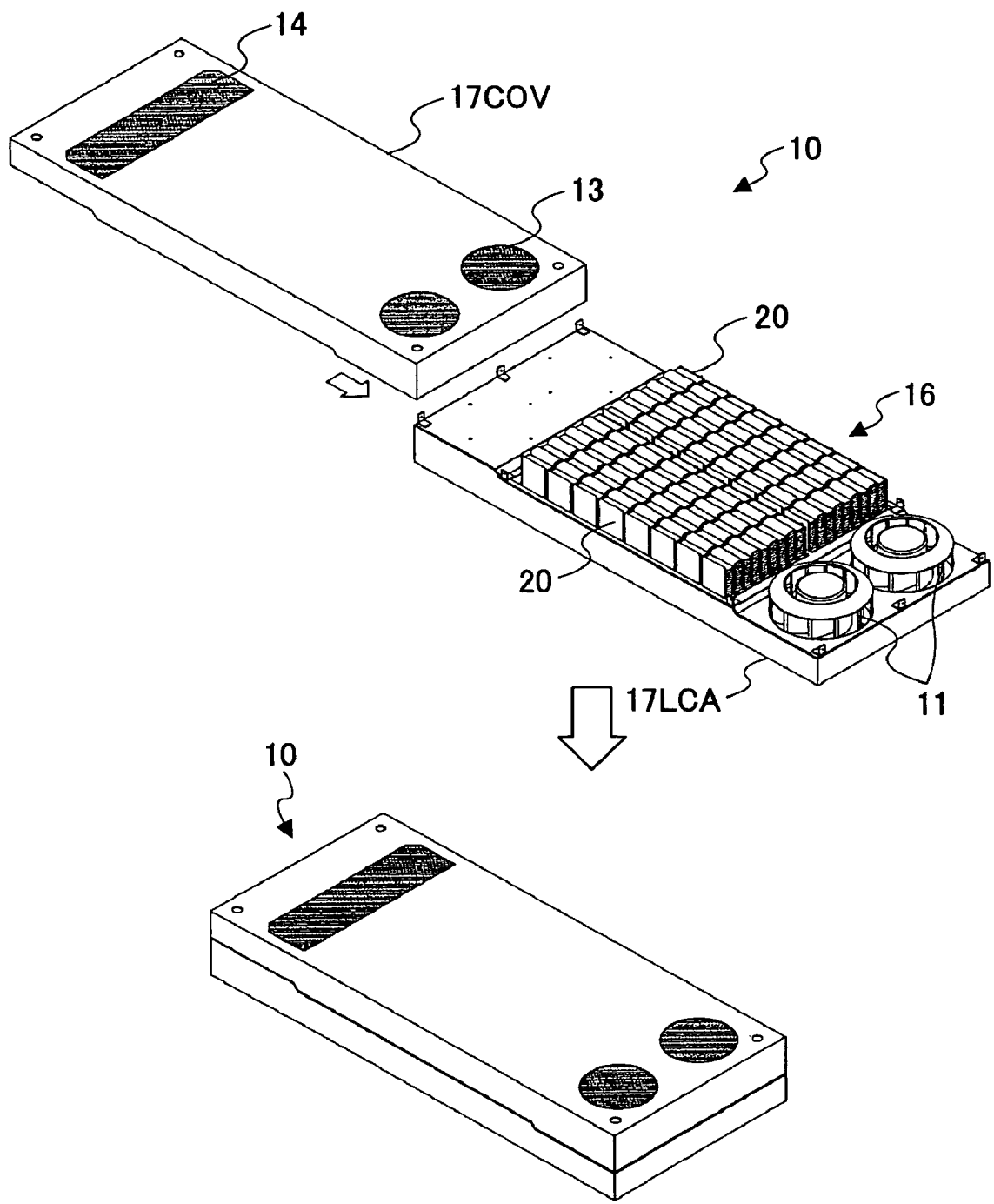
FIG. 3 is a schematic drawing showing a removed heat exchanger according to an embodiment of the present invention.

FIG. 3 is a diagram showing a perspective view of the exemplary heat exchanger 10 in a state removed from the cabinet 1. The upper portion of FIG. 3 shows the heat exchanger 10 in a lying state where a cover 17COV of its front side is detached, and the lower portion of FIG. 3 shows an external view of the heat exchanger 10 in a state where the cover 17COV is attached to a casing base part 17LCA.

The casing 17 is formed of the cover 17COV, the casing base part 17LCA, and a bottom part 17BAS (not shown in FIG. 3). The above-mentioned intake port 13 and the exhaust port 14 are formed in the cover 17COV as illustrated in FIG. 3, for example.

The heat exchange part 16 is situated at a center part of the casing base part 17LCA. As described above, the heat exchange part 16 includes unit modules 20 disposed in parallel. Although FIG. 3 shows only the fan 11 for drawing in air, the fan 12 for the inner side is symmetrically disposed with respect to the fan 11 and is situated beneath the casing base part 17LCA.

Figure 4A:
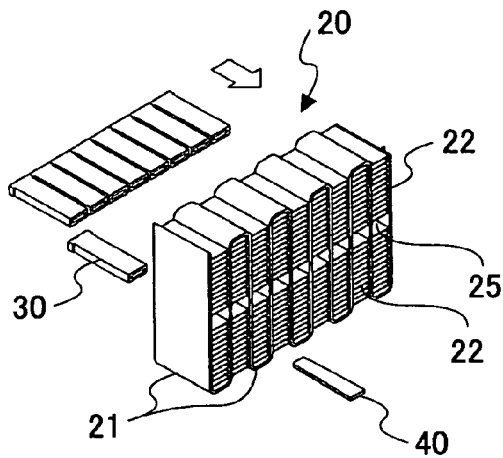
FIGS. 4A-4C are schematic drawings for describing a unit module included in a heat exchange part and an alignment of unit modules according to an embodiment of the present invention.
Figure 4B:
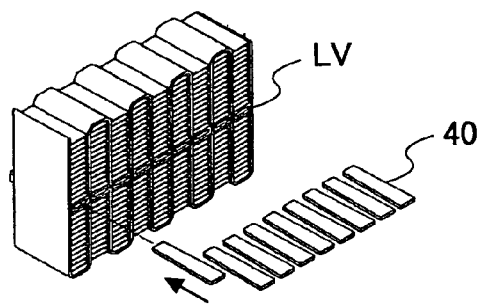
Figure 4C:
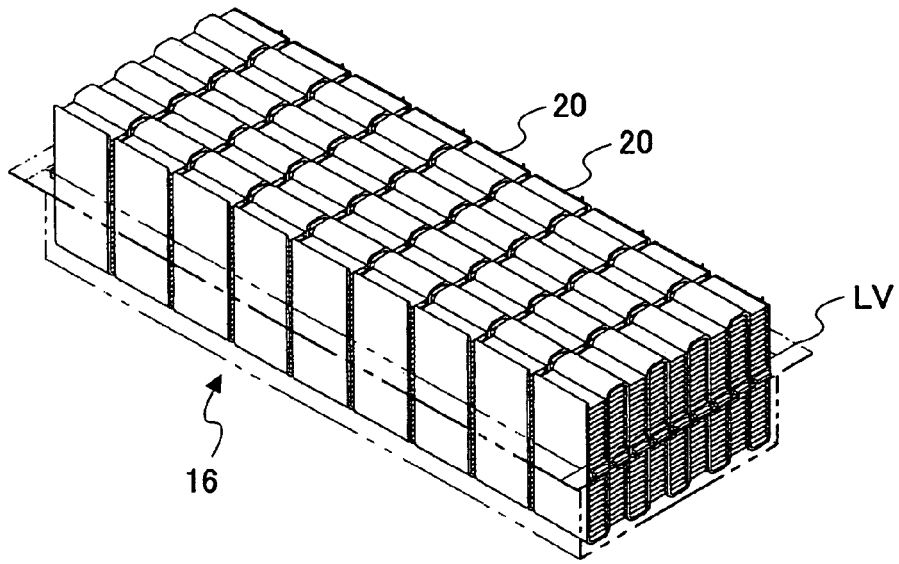

FIGS. 4A-4C are diagrams for describing an exemplary unit module 20 included in the heat exchange part 16 and an exemplary arrangement of the unit modules 20.

FIGS. 4A-4B are enlarged views of one of the unit modules 20. As shown in FIGS. 4A-4B, a unit module 20 is formed by bending a heat lane 21 in a wave-like (corrugated) form. Although not shown in FIGS. 4A-4C, plural narrow heat pipes are embedded in parallel, for example, in the heat lanes 21. Plural heat transmitting fins 22 are disposed between and soldered to the corrugated heat lane 21. A material having high heat transmitting properties, such as aluminum or copper is used in forming the heat lane 21 and the fins 22. A cooling medium (not shown) such as a cooling gas is circulated through the narrow heat pipes in the heat lanes 21. The circulation is performed independently in each of the unit modules 20. Therefore, each of the unit modules 20 independently has a heat exchange function.

By not forming the fins 22 at a center portion LV of the heat lane 21 in a height direction, plural spaces 25 are formed in the center portion LV. The center portion LV is situated substantially in the middle portion of the heat exchange part 16, and corresponds to a position at which the partition part 15 is disposed (See FIG. 2).

The heat exchange part 16 according to an embodiment of the present invention includes a dividing mechanism which divides external air and an inner side of the cabinet 1 while maintaining a water-resistant property. This dividing mechanism is described in more detail below.

The above-mentioned spaces 25 are formed at the same height level between the corrugated heat lanes 21. Plural rectangular-shaped receptacle parts (e.g. sheath parts) 30 are inserted in the spaces 25. The receptacle parts 30 are formed of a material having elastic and water-resistant properties, such as neoprene rubber or silicon rubber. FIG. 4B shows a state where the receptacle parts 30 are inserted into all of the spaces 25.

As shown in the example of FIG. 4B, plural plates (planar members) 40 are inserted in the receptacle parts 30 from a side of the heat lane opposite of the side at which the receptacle parts 30 are inserted in the spaces 25. Plates 40 are formed of, for example, an aluminum material. The plates 40 are inserted into the respective receptacle parts 30, to thereby obtain a partition structure.

More specifically, the above-described structure is applied with a packing technique. That is, the receptacle parts 30, being formed of elastic and water-resistant material, are inserted in the spaces 25, and the plates 40 are inserted in the receptacle parts 30, to thereby attain water-resistant properties in the exemplary unit module 20.

As shown in FIG. 4C, the heat exchange part 16 is formed by aligning the unit modules 20 in parallel.

The partition structure according to an embodiment of the present invention, which forms the spaces 25, and includes the receptacle parts 30, and the plates 40, enables each of the unit modules 20 to be divided into an inner side of the cabinet 1 and an outer side of the cabinet 1 (upper side and lower side in FIGS. 4A-4C) and provides a water-resistant property function.

Figure 5A:
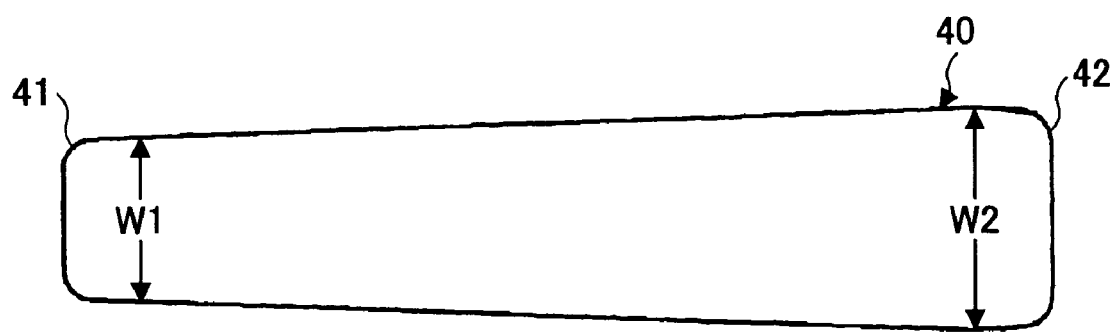
FIGS. 5A-5B are enlarged views showing a plate according to an embodiment of the present invention.
Figure 5B:

FIGS. 5A and 5B are enlarged views of an exemplary plate 40 in accordance with an embodiment of the present invention. The plate 40 includes a front end part 41 and a rear end part 42. FIG. 5A is a plan view of the plate 40, and FIG. 5B is a side view of the plate 40. As shown in FIG. 5A, the plate 40 is molded (shaped) into a form in which the width W2 of a rear side of the plate 40 is wider than the width W1 of an insertion side (front side) of the plate 40.

Figure 6A:
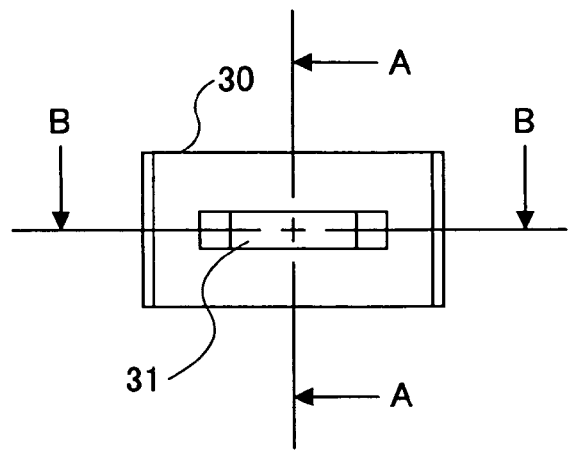
FIGS. 6A-6C are enlarged views showing a receptacle part for receiving a plate according to an embodiment of the present invention.
Figure 6B:
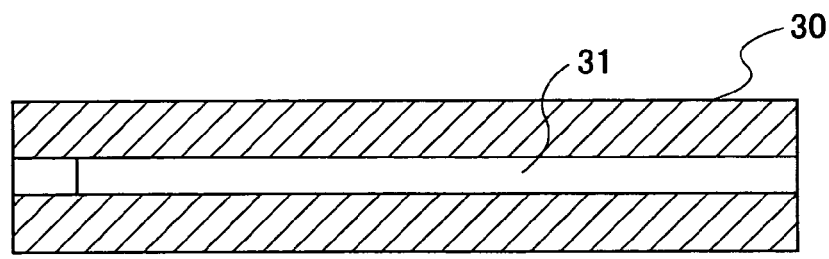
Figure 6C:
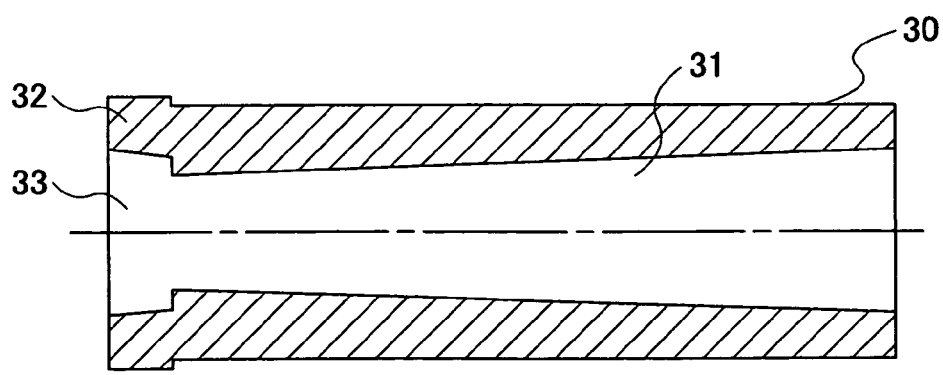

FIGS. 6A-6C are enlarged views of an exemplary receptacle part 30 in accordance with an embodiment of the present invention. The receptacle part 30 receives the plate 40. FIG. 6A is a diagram of the receptacle part 30 as viewed from the side where the receptacle part 30 is inserted into the space 25, that is, the tailing end of the receptacle part 30. FIG. 6B is a cross-sectional view along line A-A of FIG. 6A. FIG. 6C is a cross-sectional view along line B-B of FIG. 6A.

As shown in FIGS. 6A-6C, the receptacle part 30 defines a passage 31 is provided therein with a passage 31 having a space for receiving the plate 40. The passage 31 is tapered from its front end side (right side in FIG. 6C) inward so that a wedging effect can be attained when the plate 40 is inserted therein. The left end side of the passage 31 is enlarged to form a stepped connection part 32. The stepped connection part 32 has an enlarged tapered portion 33 forming part of the passage 31.

More particularly, the connection part 32 is formed for receiving a rear end part of another adjacent plate 40 (described below) and defining mutual positions with respect to the unit modules 20 disposed at its front and rear side. The mechanism for defining the positions of the unit modules 20 are described in further detail below with reference to FIG. 7.

Figure 7:
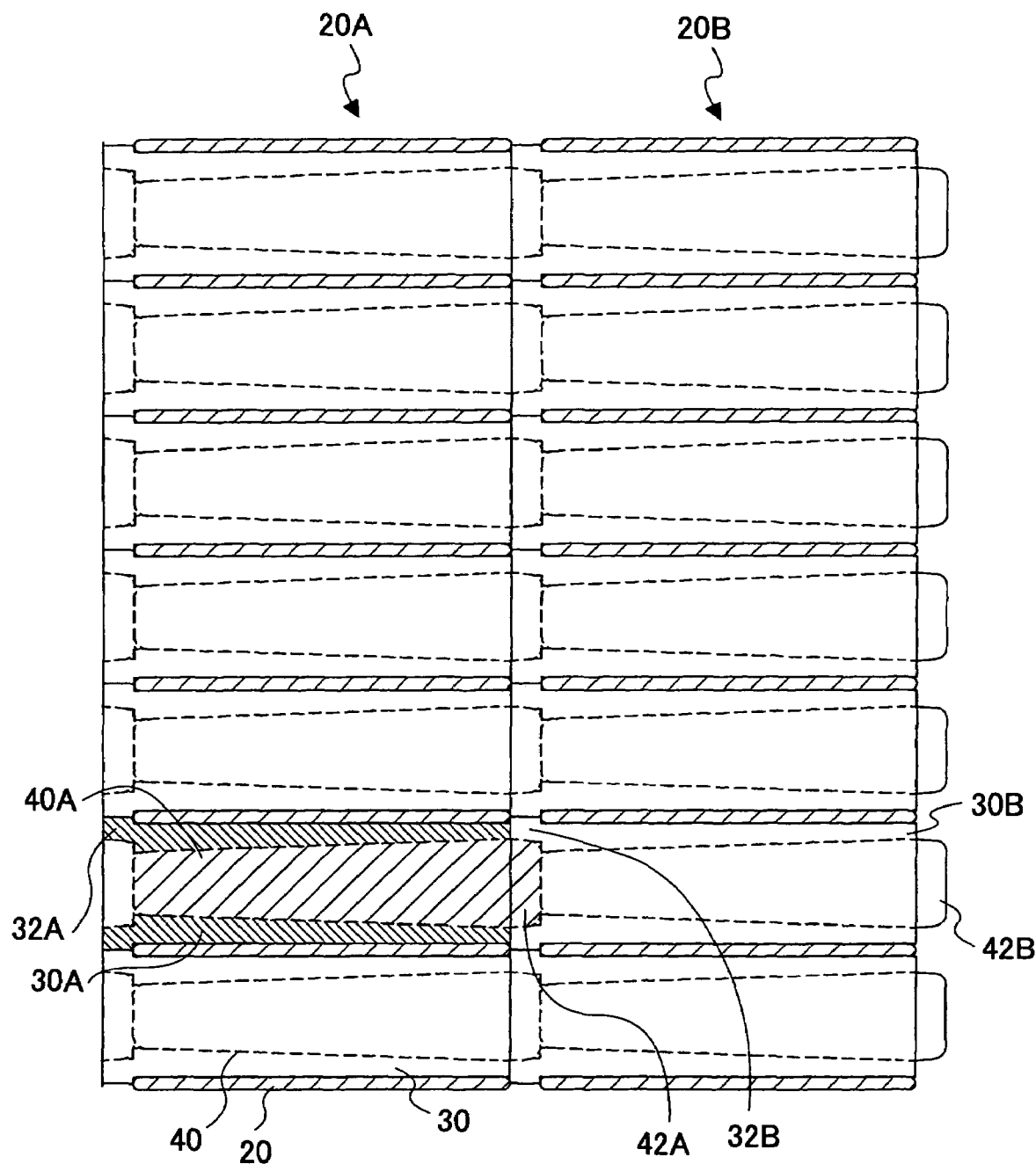
FIG. 7 is a diagram showing a connected state between two unit modules according to an embodiment of the present invention when viewed from a top side.

FIG. 7 is a diagram showing a connected state between two exemplary unit modules 20A and 20B when viewed from a top side of, for example FIGS. 3A-3D, or 4C. FIG. 7 shows the receptacle parts 30 inserted in the spaces 25 corresponding to each of the unit modules 20A and 20B, and thus the plates 40 being inserted in the corresponding receptacle parts 30.

For example, in the hatched area in the position second from bottom in FIG. 7, a plate 40A is shown inserted in a receptacle part 30A belonging to the unit module 20A disposed on a front side. The plate 40A is thoroughly inserted in the receptacle part 30A for creating the aforementioned wedging effect, and is pressed against an inner wall of the heat lane 21, to thereby provide sufficient water-resistant properties.

The plate 40A, being disposed in such a state, has its rear end part 42A protruding from a rear end of the receptacle part 30A. The rear end part 42A is housed in the connection part 32B formed at the front end of the adjacent receptacle part 30B belonging to the unit module 20B disposed on a rear side (right side of FIG. 7).

By inserting the plate 40A belonging to the front side unit module 20A in a manner that the rear end part 42A of the plate 40A is housed in the connection part 32B of the receptacle part 30B belonging to the rear side unit module 20B, the positions of the modules 20 disposed in front and in back of each other can be easily and securely defined. Although FIG. 7 shows an example of defining the position of two unit modules 20A and 20B, this example is also applicable to a case of aligning more than two unit modules 20.

Figure 8:
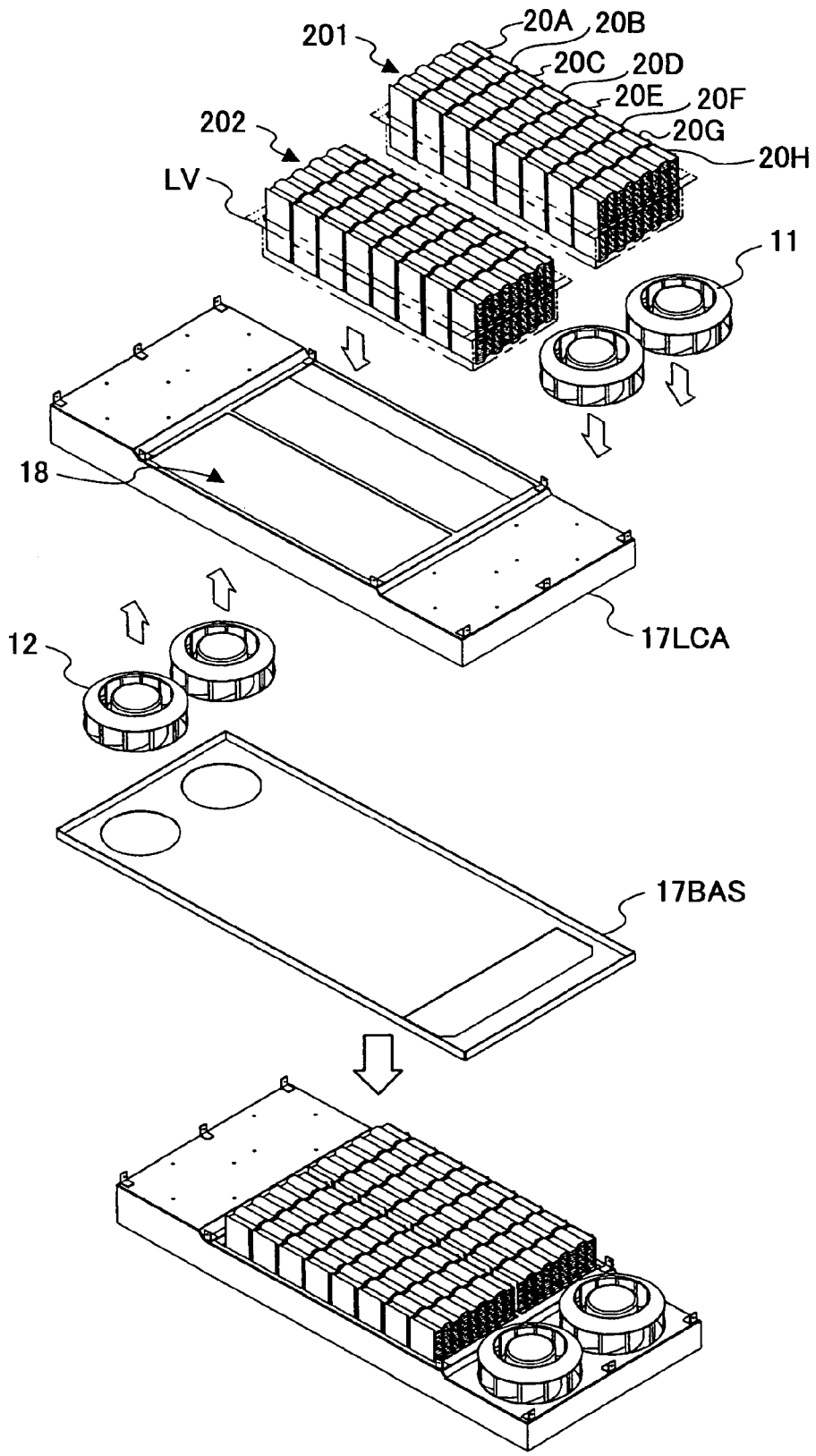
FIG. 8 is a diagram for describing assembly of a heat exchange part having a plurality of unit modules according to an embodiment of the present invention.

FIG. 8 is a diagram showing an example of assembling an exemplary heat exchange part 16 having plural unit modules 20 to an exemplary casing base part 17LCA of the heat exchanger 10 according to an embodiment of the present invention. In this example, eight (20A-20H) unit modules 20 are aligned to form a first heat exchange unit 201. A second heat exchange unit 202, also having eight unit modules, is formed in the same manner. Accordingly, the heat exchange part 16 according to the embodiment of the present invention includes the two heat exchange units 201 and 202.

Each of the unit modules 20 has an independent cooling function, and do not require a long heat pipe for circulating a cooling medium as the conventional heat exchanger. Accordingly, the heat exchange part 16 according to an embodiment of the present invention provides a high heat efficiency which is improved approximately 1.5 times compared to the conventional heat exchanger. Accordingly, since the size of the heat exchanger part 16 can be reduced, size reduction of the entire heat exchanger 10 can be achieved.

The heat exchange part 16 having an alignment of the unit modules 20 is fixedly embedded into a space 18 provided in the casing base part 17LCA. The heat exchange part 16 is assembled so that the center portion LV (middle area in the height direction of the heat exchange part 16) corresponds to the position at which the above-described partition part 15 is disposed.

Then, by assembling the fans 11 and 12 to the heat exchange part 16, the heat exchanger 10 shown in FIG. 3A-3B can be obtained. The casing base part 17LCA and bottom part 17BAS are assembled together in a suitable manner, for example, as shown in FIG. 8. In FIG. 8, the cover 17COV is omitted therefrom.

The heat exchange part 10 according to an embodiment of the present invention preferably includes a fixing mechanism (s) that fixes the heat exchange part 16 in the space 18 provided in the casing base part 17LCA. A preferable first fixing mechanism is described below with reference to FIGS. 9-13.

Figure 9:
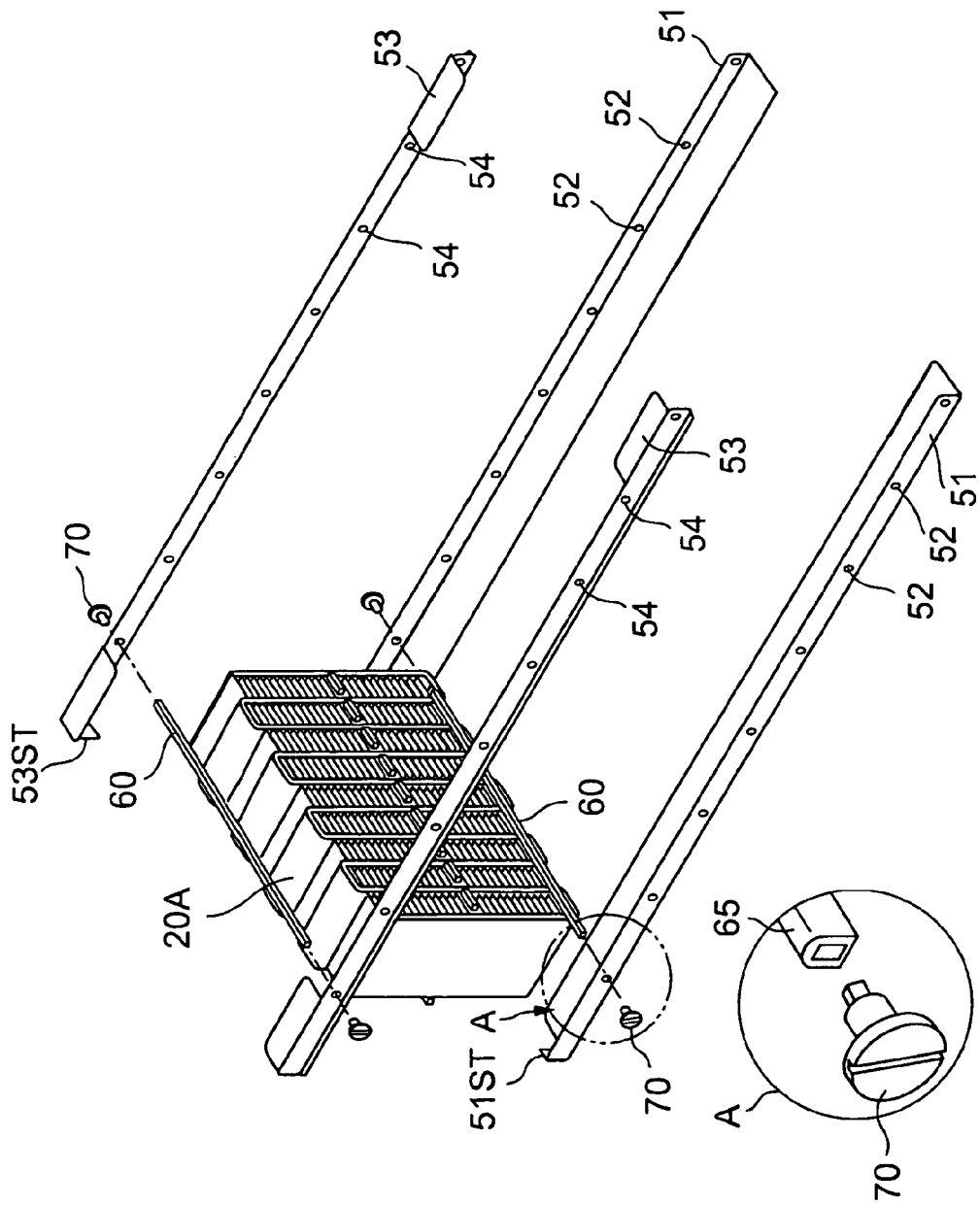
FIG. 9 is a diagram for describing a first fixing mechanism according to an embodiment of the present invention.

FIG. 9 shows an example of fixing the first heat exchange unit 201 shown in FIG. 8 to a holding member(s). Since each of the unit modules 20 of the heat exchange part 16 is provided with the above-described position defining mechanism, each of the unit modules 20 can have its position securely defined with respect to other unit modules 20 disposed at its front and back sides. This state can be maintained by using the first fixing mechanism described below.

As shown in FIG. 9, each unit module 20 is held by a pair of lower holding members 51 at its lower side, and a pair of upper holding members 53 at its upper side. The lower holding member 51 has a flange part 54 for supporting the bottom plane of the unit module 20. Both lower and upper holding members 51 and 53 have claw-like stopper parts 51ST and 53ST disposed at their ends for defining the position of an end of the first unit module 20 mounted to the lower and upper holding members 51 and 53.

Furthermore, the lower and upper holding members 51 and 53 have apertures 52, 54 disposed in intervals corresponding to the width of the unit modules 20, for allowing a tab 70 (described below) to be inserted therethrough.

FIG. 9 is an exploded view showing the first unit module 20 mounted to the lower and upper holding members 51 and 53. After the first unit module 20 is abutted against the stopper parts 51ST and 53ST, fixing rods 60 are disposed between the pair of lower holding members 51 and the pair of upper holding members 53, respectively. Here, the fixing rod 60 on the upper side is disposed between the upper holding members 53 and aligned with the apertures 54, the fixing rod 60 on the lower side is disposed between the lower holding members 51 and aligned with the apertures 52. The tabs 70 are inserted through the apertures 52, 54 and into opposite ends of the fixing rod 60 from the outer side of the upper and lower holding members 51, 53, which thereby allows the tabs 70 to rotate the fixing rods 60. It is to be noted that the area indicated with reference letter A at the bottom left side of FIG. 9 is an enlarged view of the insertion of the tab 70.

By rotating the fixing rod 60 with the tab 70, the unit module 20A is abutted against the stopper parts 51ST and 53ST. This is described below with reference to FIG. 10.

Figure 10:
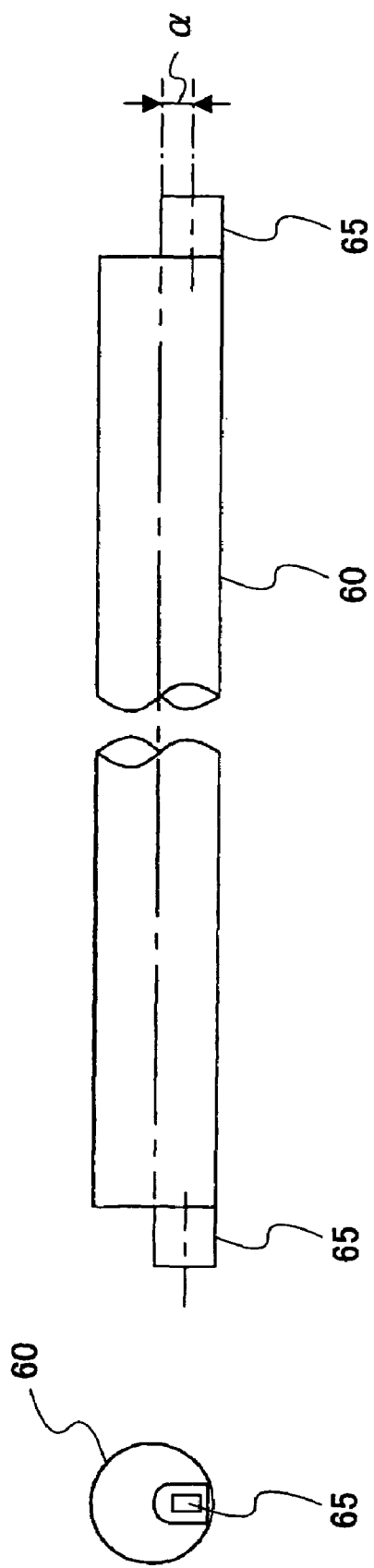
FIG. 10 is an enlarged view showing a fixing rod of a first fixing mechanism according to an embodiment of the present invention.

FIG. 10 is an enlarged view of the fixing rod 60. At the left side of FIG. 10, the fixing rod 60 is shown when viewed from its end part. As shown in FIG. 10, insertion parts (sockets) 65 are formed on both ends of the fixing rod 60 for receiving the tabs 70. The fixing rod 60 has a substantially cylindrical shape. The insertion parts 65, being formed on both ends of the fixing rod 60, are offset a radial distance α with respect to the center of the fixing rod 60. Accordingly, by rotating the fixing rod 60 via the tabs 70 being inserted in the insertion parts 65, the back part of the unit module 20A can be pushed a length (distance) of α, as shown in FIG. 11.

Figure 11:
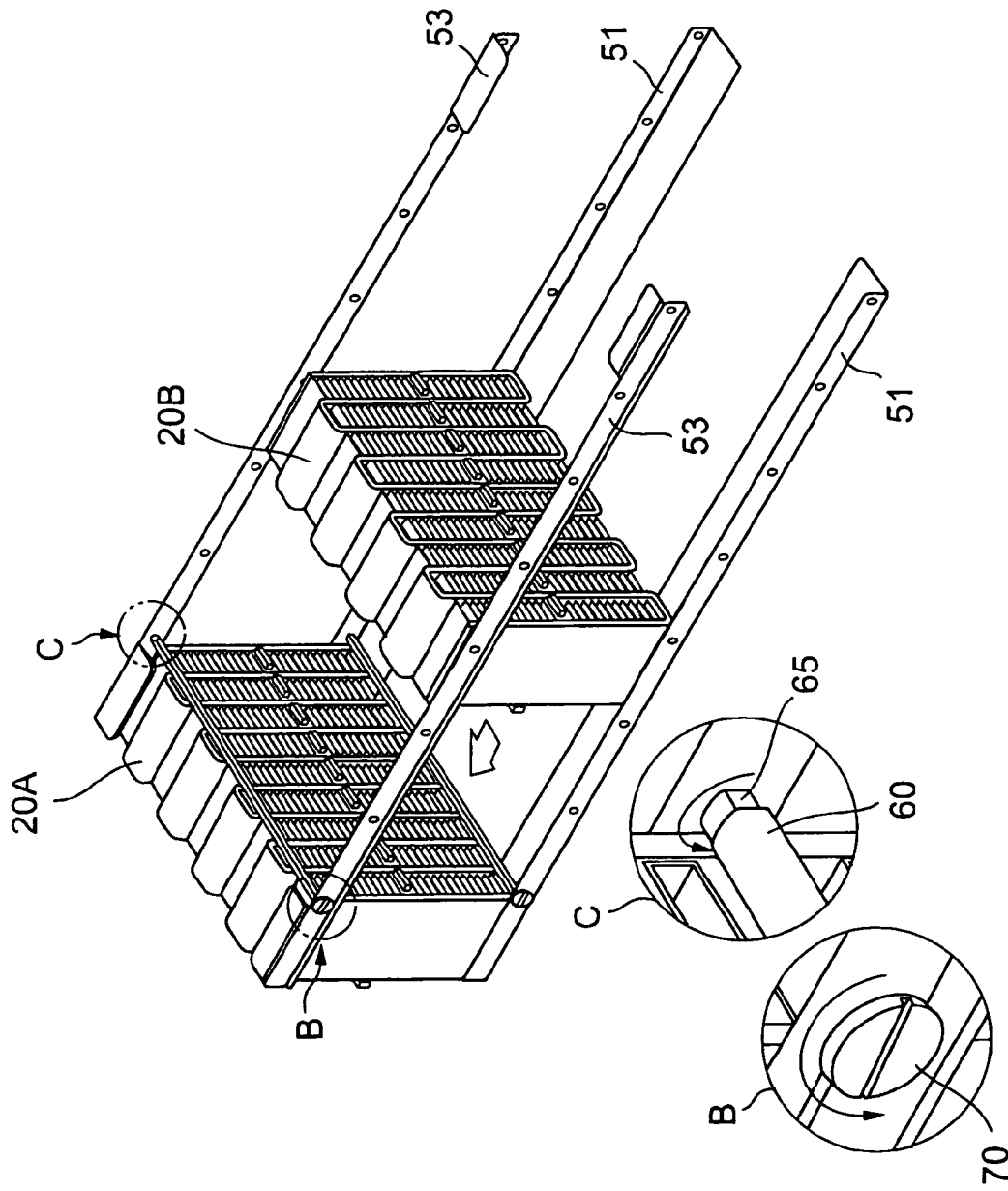
FIG. 11 is a diagram for describing assembly of a first fixing mechanism according to an embodiment of the present invention.

It is to be noted that the area indicated with reference letters B and C at the bottom left side of FIG. 11 are enlarged views showing the rotation of the fixing rod 60. As shown in FIG. 11, the unit module 20A is securely fixed by being abutted against the stopper parts 51ST and 53ST by the rotating of the upper and lower fixing rods 60 via the tabs 70.

Figure 12:
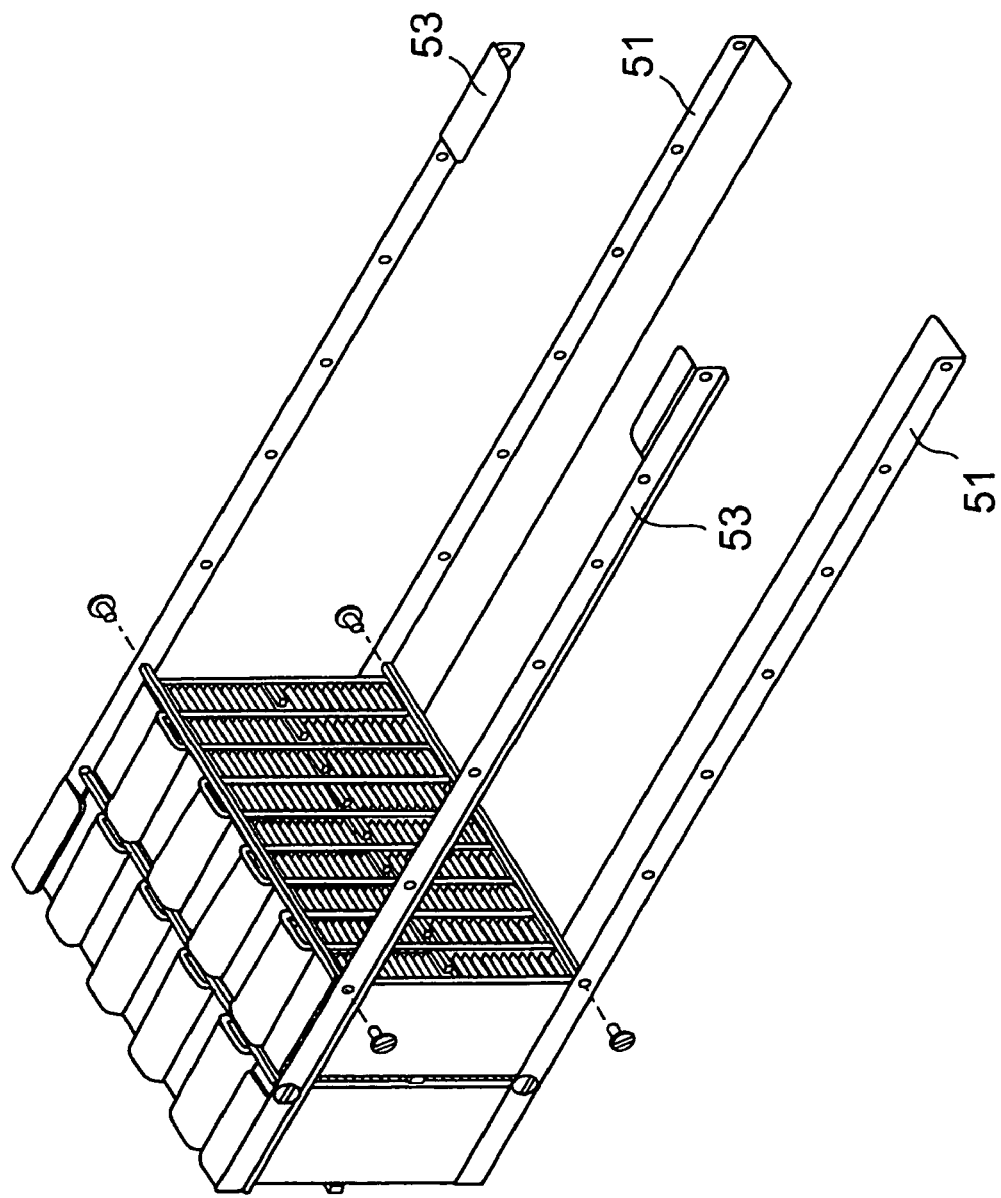
FIG. 12 is another diagram for describing assembly of a first fixing mechanism according to an embodiment of the present invention.
Figure 13:
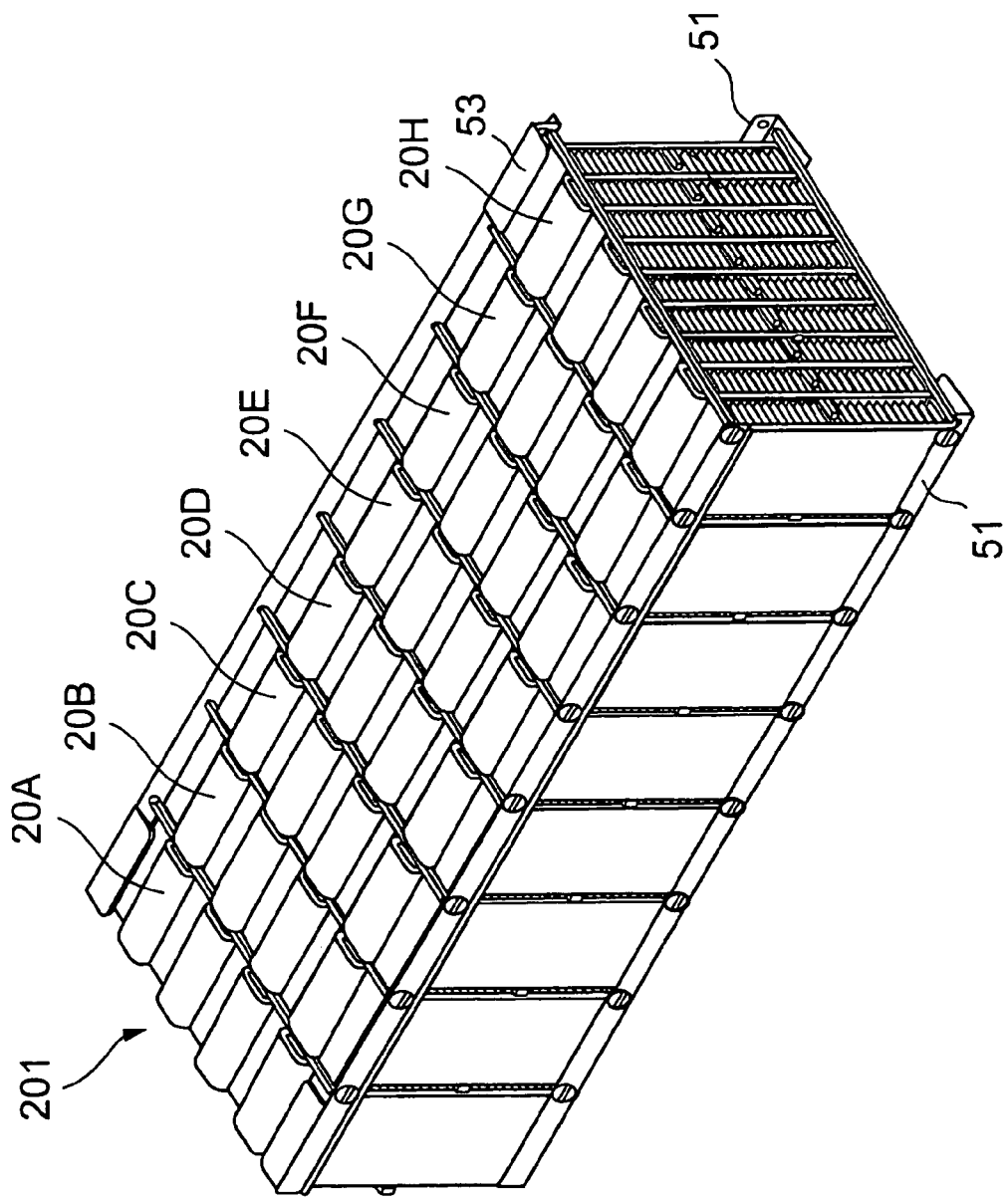
FIG. 13 is a diagram showing a completed assembled state of a first fixing mechanism according to an embodiment of the present invention.

After fixing the first unit module 20A, the unit modules 20B-20H (see FIG. 8) are sequentially fixed as shown in FIGS. 11 and 12. Finally, as shown in FIG. 13, the first heat exchange unit 201 being fixed to the holding members 51 and 53 is obtained.

Accordingly, since the position defining mechanism effectively serves to fix the respective unit modules 20 in a case of employing the first fixing mechanism, the first heat exchange unit 201 can be formed with satisfactory precision. Furthermore, the fixing mechanism using the fixing rods 60 serves to maintain the fixed state. The second heat exchange unit 202 can be formed in a likewise manner.

Next, a preferable second fixing mechanism according to an embodiment of the present invention is described below with reference to FIGS. 14-17. The characteristic parts of the second fixing mechanism are described in comparison with the first fixing mechanism.

Figure 14:
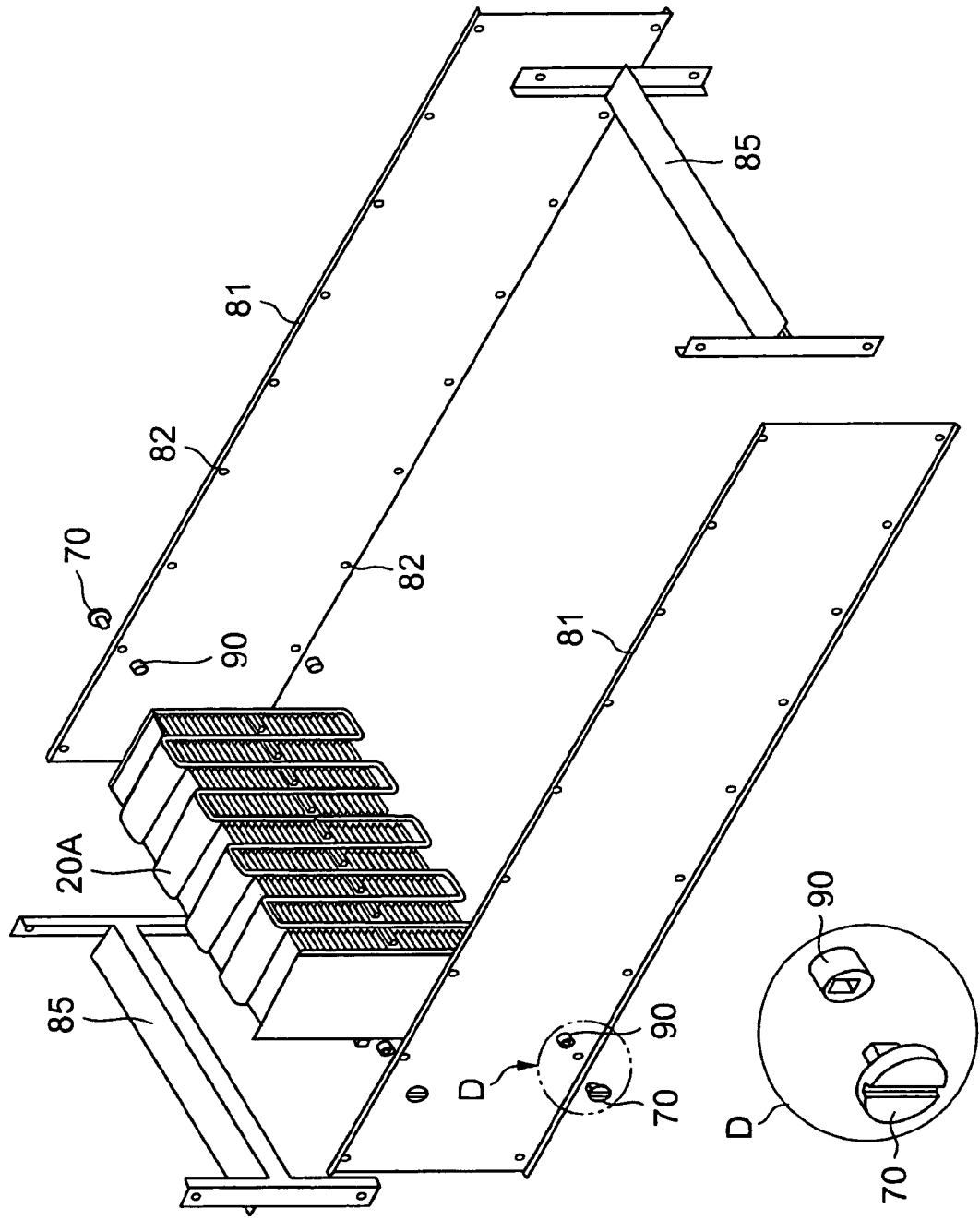
FIG. 14 is a diagram for describing a second fixing mechanism according to an embodiment of the present invention.

Similar to FIG. 9, FIG. 14 also shows an example of fixing the first heat exchange unit 201 to a holding member(s). In the second fixing mechanism, a pair of side plates 81 are employed as the holding member(s). Each of the side plates 81 are formed with apertures 82 into which tabs 70 may be inserted. Similar to the apertures 52, 54 formed in the first fixing mechanism, the apertures 82 are disposed in intervals corresponding to the width of the unit modules 20. Furthermore, the second fixing mechanism includes suitable supporting members 85 disposed at opposite ends of the side plates 81 for supporting same.

As shown in an enlarged view indicated with reference letter D in FIG. 14, the second fixing mechanism employs oval-shaped cams 90 as to alternatives of the above-described fixing rods 60.

Figure 15:
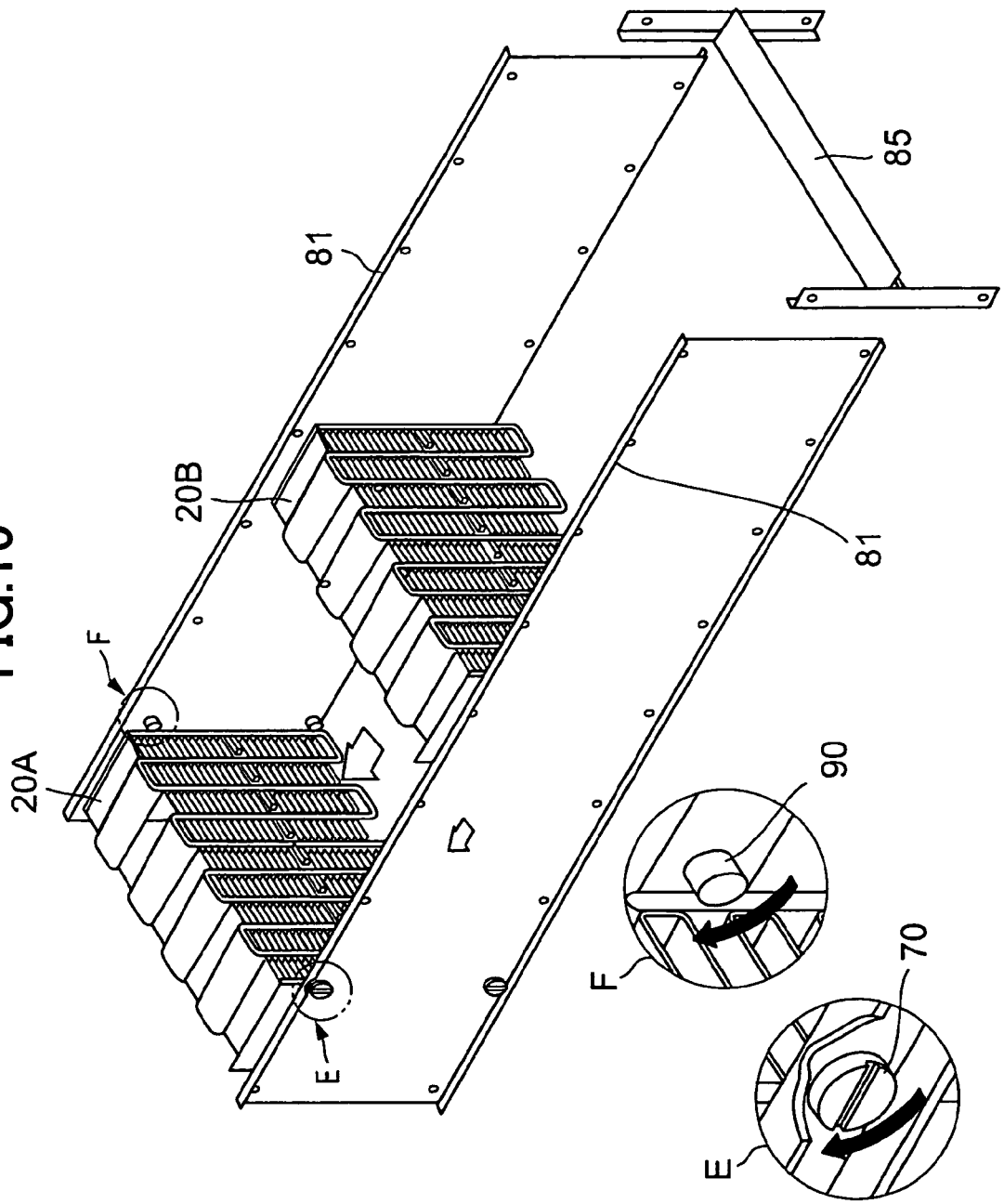
FIG. 15 is a diagram for describing assembly of a second fixing mechanism according to an embodiment of the present invention.

As shown in FIGS. 14 and 15, the cams 90 are attached to respective tabs 70 which tabs 70 extend through the apertures 82 in the respective opposite side plates 81. Thus structured, the cam 90 can be rotated by rotating the corresponding tab 70. Through such rotation of the cam 90, the cam 90 urges the unit module 20 rearwardly until the unit module 20A is abutted against the supporting member 85. In this example of the second fixing mechanism, four tabs 70 are rotated for fixing a single unit module 20, each tab 70 being located approximately at a front corner of the unit module 20 in the illustrated exemplary embodiment. The rotation of the cam 90 via the tab 70 is illustrated in the enlarged view indicated with reference letters E and F in FIG. 15.

Figure 16:
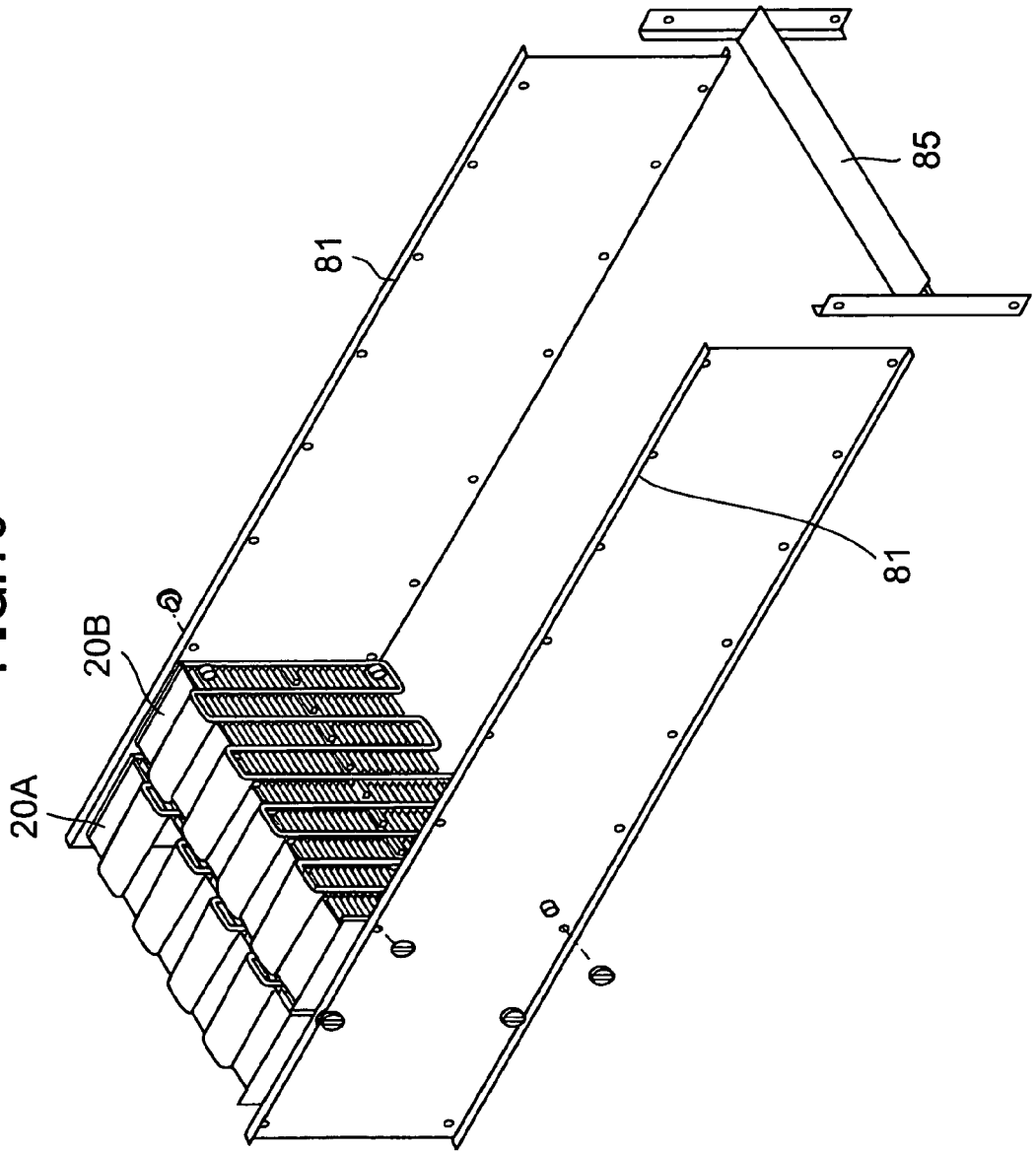
FIG. 16 is another diagram for describing assembly of a second fixing mechanism according to an embodiment of the present invention.
Figure 17:
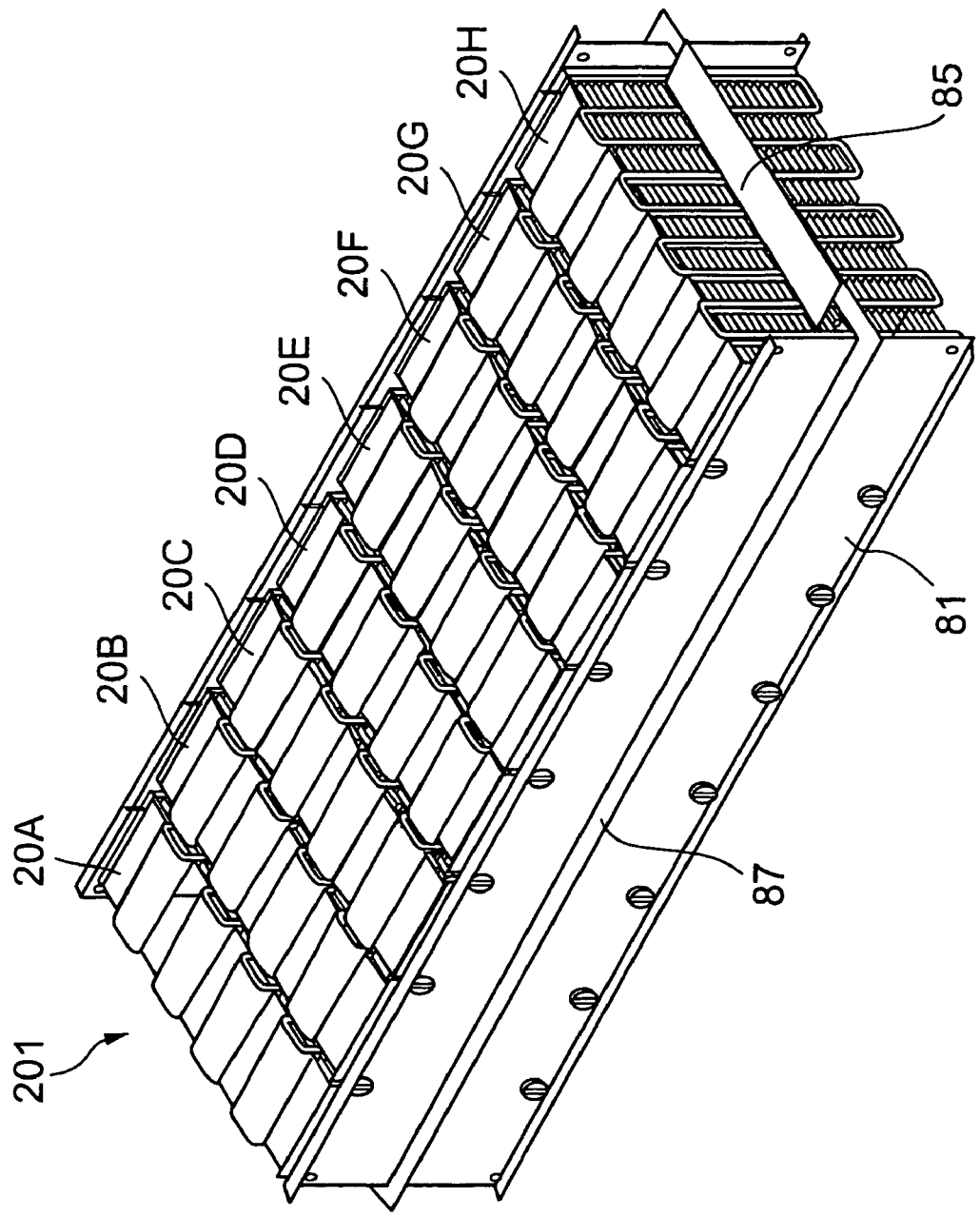
FIG. 17 is a diagram showing a completed assembled state of a second fixing mechanism according to an embodiment of the present invention.

After fixing the first unit module 20A, the unit modules 20B-20H (see FIG. 8) are sequentially fixed as shown in FIGS. 15 and 16. Finally, as shown in FIG. 17, the first heat exchange unit 201 being fixed to the side plates 81 is obtained.

Accordingly, since the position defining mechanism effectively serves to fix the respective unit modules 20 in a case of employing the second fixing mechanism, the first heat exchange unit 201 can be formed with satisfactory precision. Furthermore, the fixing mechanism using the cams 90 serves to maintain the fixed state. The second heat exchange unit 202 can be formed in a likewise manner.

Consequently, with the heat exchanger 10 according to the embodiments of the present invention, an improved heat efficiency can be attained in comparison with the conventional heat exchanger by employing an alignment of unit modules where each unit module has an independent heat exchange function. Therefore, demands for reducing size and installment space can be satisfied.

Furthermore, a partition structure having a water-resistant function can be easily provided to the heat exchange part 16 of the heat exchanger 10 by inserting the receptacle parts 30 in the spaces 25 between the heat lanes 25, and inserting the plates 40 in the receptacle parts 30. Therefore, assembly can be simplified compared to the conventional heat exchanger requiring a process such as caulking.

Furthermore, with a simple process of inserting the rear end part of the plate 40 to the connection part 32 at a front end of an adjacent receptacle part 30, the mutual positions of the unit modules 20 can be precisely defined.

Furthermore, by employing the above-described first or second fixing mechanisms, the fixed state of the heat exchange part 16 can be securely maintained for a long period.

It is to be noted that although the heat exchanger 10 according to the embodiment of the present invention is described as being disposed with respect to a part of the front side door of the cabinet 1, the heat exchanger 10 may alternatively be disposed, for example, at a portion of an outer wall such as a side wall of the cabinet 1.

Further, the present invention is not limited to these embodiments, but various variations and modifications may be made without departing from the scope of the present invention.

What is claimed is:

1. A heat exchanger comprising:
a plurality of unit modules aligned in parallel, each unit module having a heat exchange function, wherein
the unit module includes a plurality of heat transmitting fins disposed between waves of a wave-shaped heat lane,
the unit module has a partition mechanism for dividing the unit module into a heat releasing side and a heat absorbing side,
the partition mechanism defines a plurality of spaces disposed within the wave-shaped heat lane, and includes a plurality of receptacle parts selectively insertable into the spaces, and a plurality of plate members selectively insertable into the receptacle parts, and
wherein each of the plate members has a rear end part that protrudes from the receptacle part when inserted into the receptacle part, wherein the receptacle part has a connection part formed at a front end side for receiving the rear part of another plate member.

2. The heat exchanger as claimed in claim 1, wherein the receptacle parts have at least one of a water resistant property and an elastic property.

3. The heat exchanger as claimed in claim 1, further comprising a plurality of holding members for holding the unit modules in the aligned state, wherein the holding members include a fixing mechanism for fixing the unit modules.

4. The heat exchanger as claimed in claim 1, wherein the heat exchanger is disposed at a part of an outer wall of a cabinet.

* * * * *